(12) United States Patent
Shelnutt et al.

(10) Patent No.: US 8,934,244 B2
(45) Date of Patent: Jan. 13, 2015

(54) SYSTEM AND METHOD FOR COOLING INFORMATION HANDLING RESOURCES

(75) Inventors: Austin Shelnutt, Pflugerville, TX (US); Christian Petersen, Cedar Park, TX (US); John Stuewe, Round Rock, TX (US); Joseph Michael Sekel, Austin, TX (US); Richard Mills, Cedar Park, TX (US); Shane Kavanagh, Leander, TX (US)

(73) Assignee: Dell Products L.P., Round Rock, TX (US)

( * ) Notice: Subject to any disclaimer, the term of this patent is extended or adjusted under 35 U.S.C. 154(b) by 454 days.

(21) Appl. No.: 13/283,945

(22) Filed: Oct. 28, 2011

(65) Prior Publication Data

US 2013/0106265 A1     May 2, 2013

(51) Int. Cl.
*H05K 7/20* (2006.01)
*G06F 1/18* (2006.01)
*G06F 1/20* (2006.01)

(52) U.S. Cl.
CPC ........ *H05K 7/20254* (2013.01); *H05K 7/20272* (2013.01); *G06F 1/183* (2013.01); *G06F 1/20* (2013.01); *G06F 2200/201* (2013.01)
USPC ......... 361/699; 361/701; 312/223.1; 312/236

(58) Field of Classification Search
USPC ...................... 361/676–678, 679.46–679.54, 361/688–722, 752, 831
See application file for complete search history.

(56) References Cited

U.S. PATENT DOCUMENTS

| | | | |
|---|---|---|---|
| 6,674,643 B2 * | 1/2004 | Centola et al. ................. | 361/720 |
| 6,796,372 B2 * | 9/2004 | Bear ........................ | 165/104.21 |
| 7,403,384 B2 * | 7/2008 | Pflueger ........................ | 361/688 |
| 7,626,820 B1 * | 12/2009 | Konshak et al. .............. | 361/700 |
| 8,305,754 B2 * | 11/2012 | Wu et al. ....................... | 361/688 |
| 8,437,129 B2 * | 5/2013 | Tung et al. ............... | 361/679.47 |
| 2003/0128525 A1 * | 7/2003 | Berry et al. .................... | 361/726 |
| 2007/0297136 A1 * | 12/2007 | Konshak ........................ | 361/699 |
| 2008/0013283 A1 * | 1/2008 | Gilbert et al. ................. | 361/715 |
| 2008/0043442 A1 * | 2/2008 | Strickland et al. ............ | 361/709 |
| 2009/0080151 A1 * | 3/2009 | Kalms et al. ............. | 361/679.52 |
| 2009/0161312 A1 * | 6/2009 | Spearing et al. ......... | 361/679.47 |

* cited by examiner

*Primary Examiner* — Courtney Smith
(74) *Attorney, Agent, or Firm* — Baker Botts L.L.P.

(57) ABSTRACT

A system may include a chassis having a pair of stationary rails mechanically coupled thereto. Each stationary rail may receive a corresponding telescoping sliding rail. Each stationary rail/sliding rail combination may be configured to convey a cooling fluid to or from a heat exchanger.

18 Claims, 4 Drawing Sheets

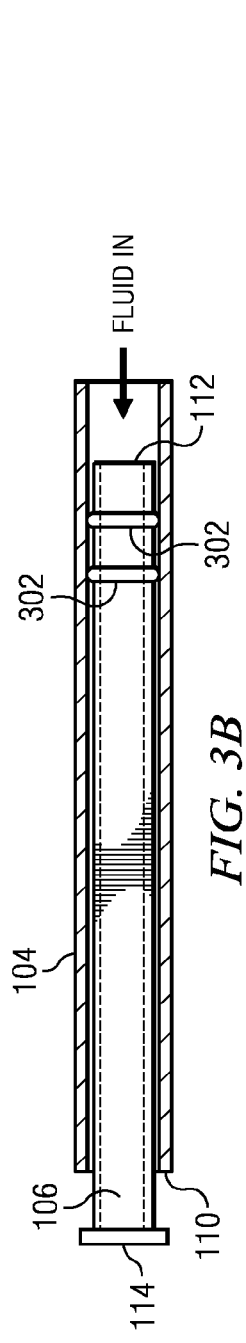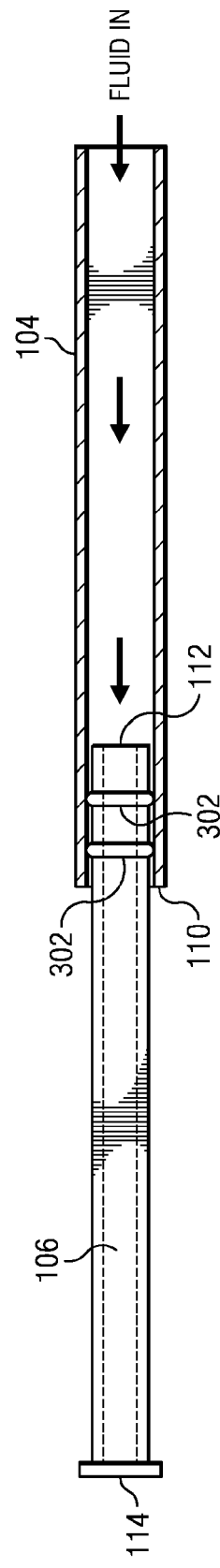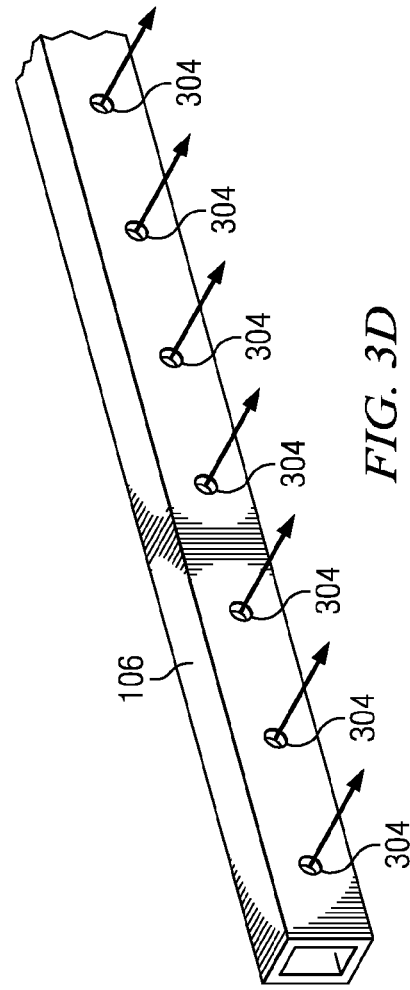

SYSTEM AND METHOD FOR COOLING INFORMATION HANDLING RESOURCES

TECHNICAL FIELD

The present disclosure relates in general to cooling information handling resources, and more particularly to fluid cooling of individual components of an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As the capabilities of information handling systems have improved, the power requirements of information handling systems and their component information handling resources have increased. Accordingly, the amount of heat produced by such information handling resources have increased. Because the electrical properties of information handling resources may be adversely affected by the presence of heat (e.g., some information handling resources may not operate correctly outside of a particular range of temperatures), information handling systems often include cooling systems configured to cool such information handling resources.

Traditionally, information handling resources have been cooled via the impingement of air driven by one or more fans. As the density of information handling resources present in information handling systems have increased, and as information handling resources have become faster (and thus hotter), the airflow required to provide adequate cooling has increased, leading to the need for more powerful fans and/or greater numbers of fans. This leads to yet more power consumption, larger information handling system size, and excessive noise. In addition, because fans often transfer heat to those areas proximate to the information handling system being cooled, users of such information handling systems are often required to tolerate higher-than-typical temperatures.

SUMMARY

In accordance with the teachings of the present disclosure, the disadvantages and problems associated with cooling information handling resources have been substantially reduced or eliminated.

In accordance with embodiments of the present disclosure, a system may include a first stationary rail configured mechanically couple to a chassis fluidically couple to a first external fluidic conduit such that the first stationary rail may receive a cooling fluid from the first external fluidic conduit and conduct the cooling liquid internally from the first external fluidic conduit through at least a portion of the first stationary rail. The system may also include a first sliding rail configured to mechanically couple to the first stationary rail such that at least a portion of first sliding rail may telescope with at least a portion of the first stationary rail and fluidically couple to the first stationary rail such that the first sliding rail may receive the cooling fluid from the first stationary rail and conduct the cooling liquid internally from the first stationary rail through at least a portion of the first sliding rail. The system may further include a heat exchanger configured to fluidically couple to the first sliding rail such that the heat exchanger may receive the cooling fluid from the first sliding rail and conduct the cooling liquid internally from the first sliding rail through at least a portion of the heat exchanger and transfer heat from an information handling resource thermally coupled to the heat exchanger to the cooling fluid. The system may additionally include a second sliding rail configured to fluidically couple to the heat exchanger such that the second sliding rail may receive the cooling fluid from the heat exchanger and conduct the cooling liquid internally from the heat exchanger through at least a portion of the second sliding rail. The system may also include a second stationary rail configured to mechanically couple to the chassis opposite the first stationary rail, mechanically couple to the second sliding rail such that at least a portion of second sliding rail may telescope with at least a portion of the second stationary rail, fluidically couple to the second sliding rail such that the second stationary rail may receive the cooling fluid from the second sliding rail and conduct the cooling liquid internally from the second sliding rail through at least a portion of the second stationary rail, and fluidically couple to a second external fluidic conduit such that the second stationary rail delivers the cooling fluid to the second external fluidic conduit.

Technical advantages of the present disclosure may be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 3B illustrates side elevation view of selected components of a rail system for cooling an information handling resource with the rail system retracted, in accordance with embodiments of the present disclosure;

FIG. 3C illustrates side elevation view of selected components of a rail system for cooling an information handling resource with the rail system extended, in accordance with embodiments of the present disclosure; and FIG. 3D illustrates a perspective view of one side of a sliding rail of a rail system, in accordance with embodiments of the present disclosure.

DETAILED DESCRIPTION

Preferred embodiments and their advantages are best understood by reference to FIGS. 1-3D, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, fluid conduits or fluidic conduits may broadly refer to any device, system or apparatus for the conveyance of fluid (e.g., tubing, a pipe, a hollow cylinder, a channel, a microchannel, etc.).

Figure 1:
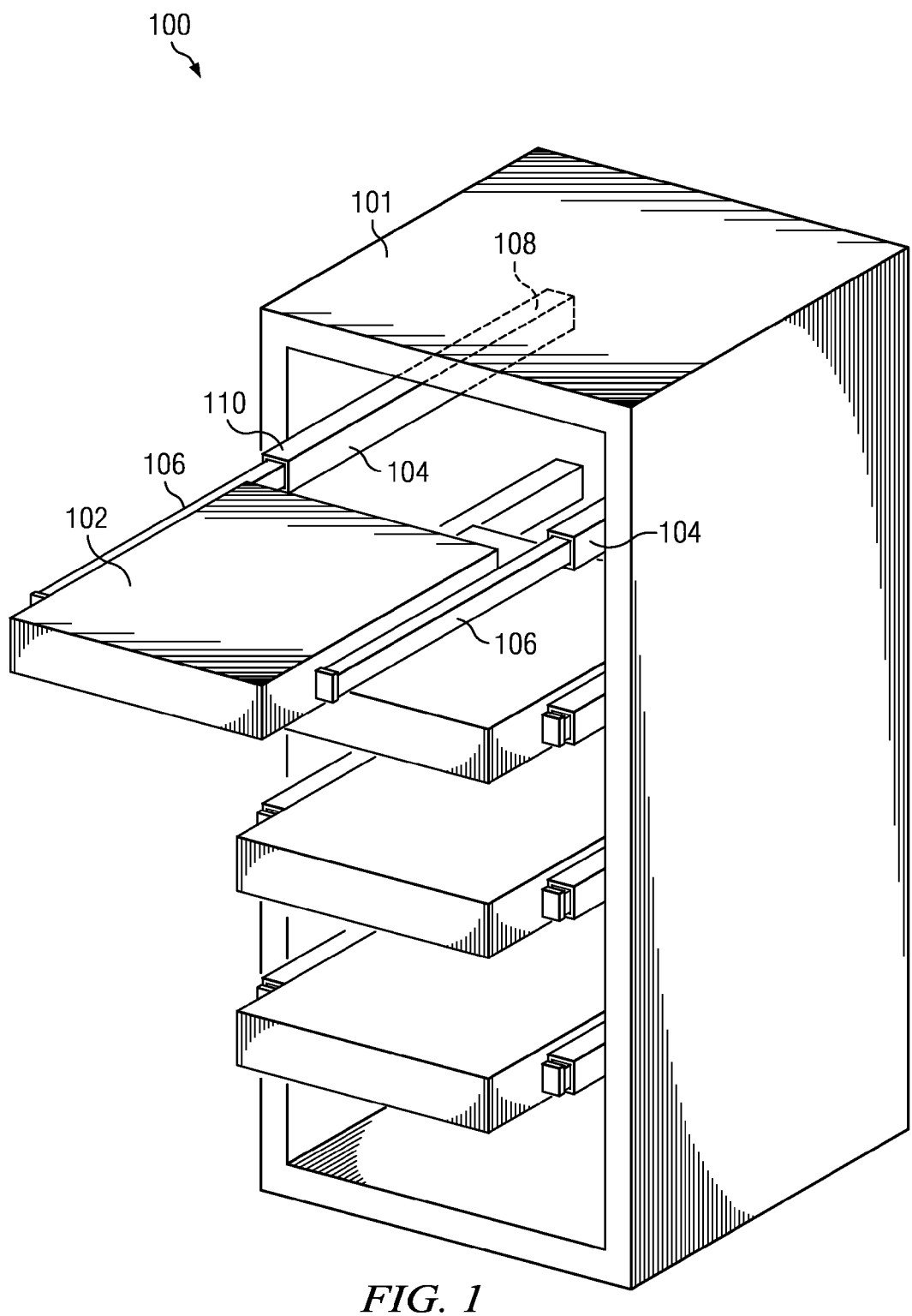
FIG. 1 illustrates an information handling system including a rail system for cooling of information handling resources, in accordance with embodiments of the present disclosure.

FIG. 1 illustrates an information handling system 100 including a rail system for cooling of information handling resources 102, in accordance with embodiments of the present disclosure. As shown in FIG. 1, information handling system 100 may include a chassis 101, one or more information handling resource assemblies 102, and a rail system corresponding to each respective information handling resource assembly 102, each rail system comprising a pair of stationary rails 104 and a pair of sliding rails 106.

Chassis 101 may include any suitable enclosure for housing information handling resources 102. For example, chassis 101 may comprise a computer chassis or enclosure configured to hold one or more server blades. As another example, chassis 101 may comprise a storage enclosure configured to hold one or more storage resources (e.g., hard disk drives).

Figure 2:
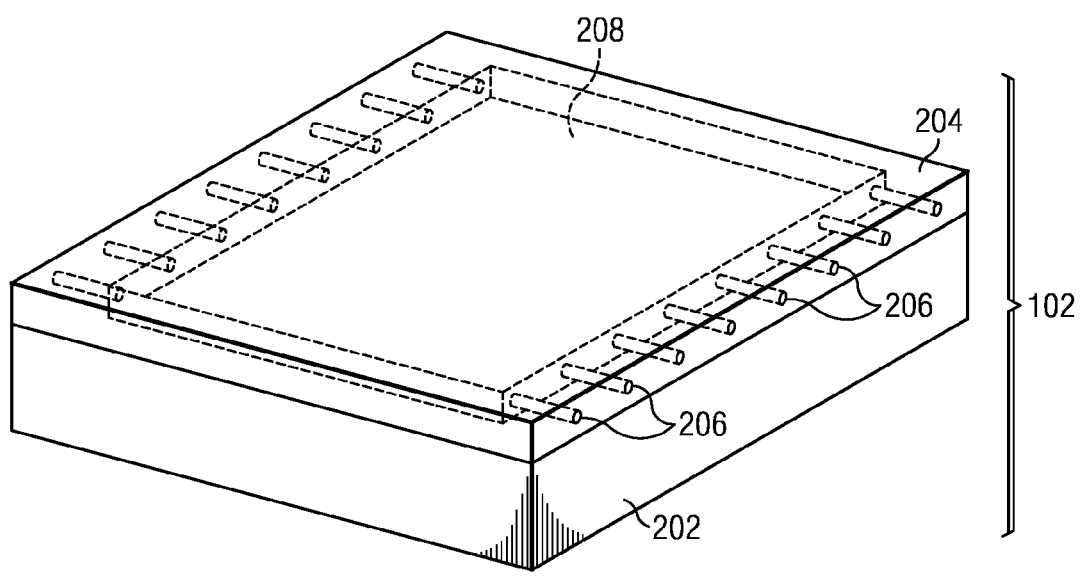
FIG. 2 illustrates an information handling resource assembly, in accordance with embodiments of the present disclosure.

An information handling resource assembly 102 may include an information handling resource and a heat exchanger thermally coupled to the information handling resource. An example of an information handling resource assembly 102 is depicted in FIG. 2. In the example of FIG. 2, information handling resource assembly 102 may include an information handling resource 202 and a heat exchanger 204. Information handling resource 202 may include any component system, device or apparatus of an information handling system, including without limitation a processor, bus, memory, input-output device and/or interface, storage resource (e.g., hard disk drives), network interface, electro-mechanical device (e.g., fan), display, power supply, and/or any portion thereof. An information handling resource may comprise any suitable package or form factor, including without limitation an integrated circuit package or a printed circuit board having mounted thereon one or more integrated circuits.

A heat exchanger 204 may comprise any system, device, or apparatus configured to thermally couple to an information handling resource 202 to transfer heat energy from the information handling resource 202 to a cooling fluid within heat exchanger 204, thus cooling information handling resource 202. In some embodiments, as shown in FIG. 2, heat exchanger 204 may comprise one or more cold plates. In other embodiments, heat exchanger 204 may comprise bare-die or direct-contact fluid immersion heat exchangers. In some embodiments, heat exchanger 204 may include fluid openings 206 for receiving fluid from and/or delivering fluid to a sliding rail 106, as described in greater detail below with respect to FIG. 3D. Such fluid openings 206 may be fluidically coupled to one or more fluid conduits 208 (e.g., plenums) predominantly internal to heat exchanger 204. Thus, in operation, heat present in an information handling resource 202 may be thermally conducted through heat exchanger 204 into the one or more conduits 208 where the heat may be thermally transferred to fluid present in conduit 208. In embodiments in which a cold plate is employed as all or part of heat exchanger 204, a cold plate may be constructed from extruded aluminum, machined aluminum, case aluminum, and/or another suitable material. In some embodiments, all or one or more portions of heat exchanger 204 may comprise a material (e.g., aluminum or other metal) that is generally thermally conductive. Openings 206 and conduit 208 may include any suitable fluidic conduit configured to transport fluid to, from, or within heat exchanger 204 and may be formed by machining, extrusion, or other suitable manner. The position, length, height, width, and other physical characteristics of openings 206 and conduit 208 may be selected based on desired cooling characteristics, desired fluid flow rates, desired fluid type, component types, component locations, expected component heat generation, and/or any other suitable characteristics of a corresponding information handling resource 202.

In addition to an information handling resource 202 and a heat exchanger 204, information handling resource assembly 102 may include components configured to mechanically and thermally couple heat exchanger 204 to information handling resource 202 (e.g., fasteners, brackets, adhesives, etc.). Also, while the foregoing discussion included an example wherein heat exchanger 204 comprises a cold plate, heat exchanger 204 may be implemented by any suitable system, device, or apparatus configured to transfer heat from an information handling resource 202 to a fluid internal to such heat exchanger 204 (e.g., tubing, piping, or other fluidic conduit).

A stationary rail 104 may include any structural member configured to mechanically support a corresponding sliding rail 106 while serving as a fluidic conduit. Accordingly, a stationary rail 104 may include a circular cylinder, elliptical cylinder, rectangular cylinder, triangular cylinder, or other suitable geometry. A stationary rail 104 may be constructed from any suitable material, including a metal (e.g., stainless steel), a plastic (e.g., polyvinyl chloride), and/or other suitable material. A stationary rail 104 may have a first end 108 and a second end 110. At its first end 108, a stationary rail 104 may be configured to fluidically couple to another fluidic conduit whereby the stationary rail 104 may receive from or deliver to the other fluidic conduit a cooling fluid. At its second end 110, a stationary rail 104 may include a suitable opening for mechanically and fluidically coupling to a corresponding sliding rail 106, as described in greater detail below with respect to the discussion of FIGS. 3A-3D. Each stationary rail 104 may be mounted or affixed to the interior of chassis 101 via fasteners, adhesives, and/or in any other suitable manner. Each stationary rail 104 may also include a corresponding paired stationary rail 104, such that each pair of stationary rails 104 may, in some embodiments and in concert with a pair of corresponding sliding rails 106, mechanically support an information handling resource 102 within chassis 101, as described in greater detail below with respect to the discussion of FIGS. 3A-3D.

A sliding rail 106 may include any structural member configured to, when properly engaged with a stationary rail 104, serve as a fluidic conduit. In some embodiments, a sliding rail 106 may also mechanically support an information handling resource 102. Accordingly, a sliding rail 106 may include a circular cylinder, elliptical cylinder, rectangular cylinder, triangular cylinder, or other suitable geometry. In many embodiments, sliding rail 106 may be of the same geometry of stationary rail 104, but may be sized such that at least a portion of sliding rail 106 may be capable of telescoping or sliding within at least a portion of stationary rail 104. A sliding rail 106 may be constructed from any suitable material, including a metal (e.g., stainless steel), a plastic (e.g., polyvinyl chloride), and/or other suitable material. A sliding rail 104 may have a first end 112 and a second end 114. At its first end 112, a sliding rail 106 may include a suitable opening for mechanically and fluidically coupling to a corresponding stationary rail 104, as described in greater detail below with respect to the discussion of FIGS. 3A-3D. At its second end 114, a sliding rail 106 may be closed so as to contain fluid internal to sliding rail 106. Each sliding rail 104 may be mounted or affixed to a information handling resource 102 via fasteners, adhesives, and/or in any other suitable manner. Each sliding rail 106 may also include a corresponding paired sliding rail 106 mounted or affixed to an opposite side of an information handling resource 102, such that each pair of sliding rails 104 may, in concert with a pair of corresponding stationary rails 104, mechanically support an information handling resource 102 within chassis 101, as described in greater detail below with respect to the discussion of FIGS. 3A-3D.

Figure 3A:
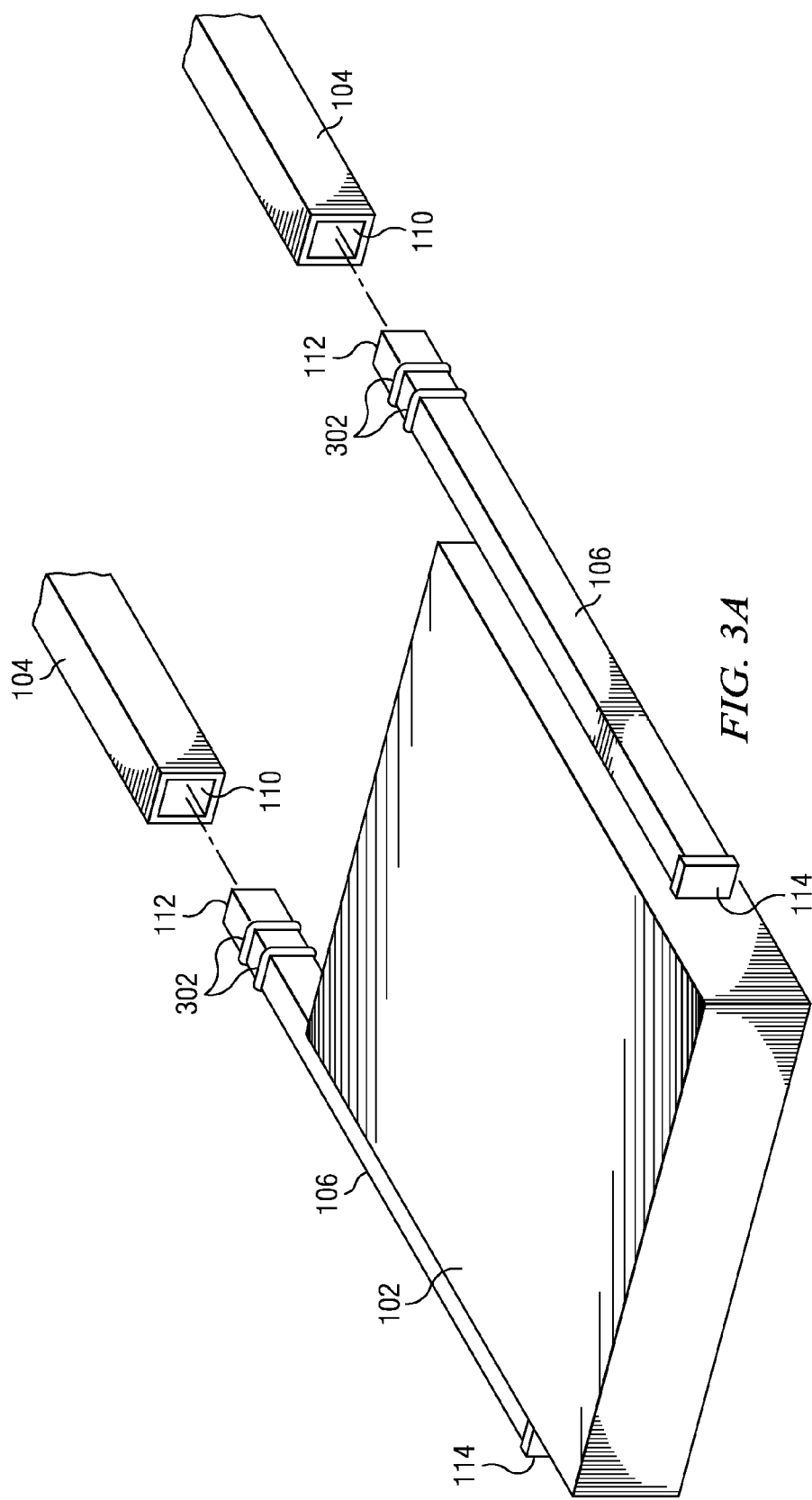
FIG. 3A illustrates an exploded perspective view of selected components of a rail system for cooling of an information handling resource, in accordance with embodiments of the present disclosure.

FIGS. 3A-3D illustrate various views of selected components of the rail system depicted in FIG. 1, in accordance with embodiments of the present disclosure. FIG. 3A illustrates an exploded perspective view, FIG. 3B illustrates side elevation view with the rail system retracted, FIG. 3C illustrates side elevation view with the rail system extended, and FIG. 3D illustrates a perspective view of one side of a sliding rail 106 of a rail system.

As shown in FIGS. 3A-3C and as described above, each sliding rail 106 may be configured to such that it may be telescopically inserted into a corresponding stationary rail 104. One or both of a sliding rail 106 and its corresponding stationary rail 104 may include one or more seals 302 to prevent fluid exiting any gap between the exterior of one rail and the interior of the other. Although FIGS. 3A-3C depict seals 302 formed on the exterior sliding rail 106, in some embodiments, one or more seals 302 may be formed in the interior of stationary rail 104. Although FIGS. 3A-3C depict sliding rail 106 having a smaller cross-sectional area than stationary rail 104, in some embodiments, sliding rail 106 may have a larger cross-sectional area, thus allowing stationary rail 106 to telescope inside of sliding rail 104. In such embodiments, one or more seals 302 may be formed in the interior of sliding rail 104 or on the exterior of stationary rail 106.

A seal 302 may be constructed of any suitable material and formed in any suitable shape. For example, a seal 302 may be constructed from rubber or other similar material. As another example, a seal 302 may be implemented as an "O-ring" or similar shape to provide a fluid seal between a sliding rail 104 and stationary rail 106.

In addition, each information handling resource assembly 102 may be mechanically as also shown in FIGS. 3A-3C and described above. Accordingly, by the application of appropriate mechanical force, a person may place a rail system of information handling system 100 in a retracted position, as shown in FIG. 3B, in an extended position as shown in FIG. 3C, or in a position between the retracted position and the extended position. Information handling resource assembly 102, sliding rails 106, and stationary rails 104 may be configured such that, when in the retracted position, information handling resource 202 may engage with chassis 101 such that information handling resource 202 becomes electrically coupled to one or more other electronic components. When desired, the rail system may be moved to its extended position, allowing an individual to service the information handling resource assembly coupled to the rail system.

While being mechanically coupled to a pair of sliding rails 106, heat exchanger 204 of information handling resource assembly 102 may also be fluidically coupled to the same pair sliding rails 104. As shown in FIG. 3D, a sliding rail 106 may include one or more fluid openings 304. Such fluid openings 304 may be configured to mate with corresponding fluid openings 206 of heat exchanger 204, such that when mated, a fluid opening 304 and a corresponding fluid opening 206 form a fluid pathway. Accordingly, fluid openings 304 and/or fluid openings 206 may be configured with suitable fluidic components (e.g., quick disconnect fittings) to form a fluidic pathway when mated.

In operation, rail systems of information handling system 100 may be configured such that fluid pressure within a first fluidic channel defined by a first stationary rail 104/sliding rail 106 combination may be higher than that of a second fluidic channel defined by a second first stationary rail 104/sliding rail 106 combination, wherein each stationary rail 104/sliding rail 106 are each fluidically coupled to a heat exchanger 204. The first sliding rail 106 may receive such fluid via the first stationary rail 104 from a fluid source (e.g., pump) fluidically coupled to stationary rail 104. Such difference in fluid pressure may induce a flow of fluid from the first sliding rail 106 to heat exchanger 204. Heat exchanger 204 may transfer heat from an information handling resource 202 thermally coupled to heat exchanger 204 to the fluid. The fluid may then flow from the second heat exchanger to the second sliding rail 106, thus potentially cooling the information handling resource 202. Fluid may then flow from the second sliding rail 106, through the second stationary rail 104, where the fluid may be further delivered to other heat exchangers for cooling information handling resources 102 and/or delivered to a heat exchanger (not expressly shown) for cooling the fluid, allowing the fluid to be recycled for further cooling of information handling resources 102.

Although the present disclosure has been described in detail, it should be understood that various changes, substitutions, and alterations can be made hereto without departing from the spirit and the scope of the disclosure as defined by the appended claims.

What is claimed is:

1. A system comprising:
   a first stationary rail to:
      mechanically couple to a chassis; and
      fluidically couple to an external fluidic source, wherein the first stationary rail receives a cooling fluid from the external fluidic source and carries the cooling liquid internally through at least a portion of the first stationary rail;

a first sliding rail to:
   mechanically couple to the first stationary rail, wherein at least a portion of first sliding rail telescopes with at least a portion of the first stationary rail; and
   fluidically couple to the first stationary rail, wherein the first sliding rail receives the cooling fluid from the first stationary rail and carries the cooling liquid internally through at least a portion of the first sliding rail;
a heat exchanger to:
   fluidically couple to the first sliding rail, wherein the heat exchanger receives the cooling fluid from the first sliding rail and carries the cooling liquid internally through at least a portion of the heat exchanger; and
   transfer heat from an information handling resource thermally coupled to the heat exchanger to the cooling fluid;
a second sliding rail to fluidically couple to the heat exchanger, wherein the second sliding rail receives the cooling fluid from the heat exchanger and carries the cooling liquid internally through at least a portion of the second sliding rail; and
a second stationary rail to:
   mechanically couple to the chassis opposite the first stationary rail;
   mechanically couple to the second sliding rail, wherein at least a portion of second sliding rail telescopes with at least a portion of the second stationary rail;
   fluidically couple to the second sliding rail, wherein the second stationary rail receives the cooling fluid from the second sliding rail and carries the cooling liquid internally through at least a portion of the second stationary rail.

2. A system in accordance with claim 1, wherein at least one of the first stationary rail, the first sliding rail, the second stationary rail, and the second sliding rail comprises one of a circular cylinder, an elliptical cylinder, a rectangular cylinder, and a triangular cylinder.

3. A system in accordance with claim 1, wherein the heat exchanger comprises a cold plate.

4. A system in accordance with claim 1, wherein the heat exchanger comprises a bare-die heat exchanger.

5. A system in accordance with claim 1, wherein the heat exchanger comprises a direct-contact fluid immersion heat exchanger.

6. A system in accordance with claim 1, further comprising at least one seal configured to provide a fluid seal between the first stationary rail and the first sliding rail.

7. A system in accordance with claim 1, further comprising at least one seal configured to provide a fluid seal between the second stationary rail and the second sliding rail.

8. A system in accordance with claim 1, the first sliding rail having one or more fluid openings configured to mate with corresponding fluid openings of the heat exchanger, such that the fluid openings of the first sliding rail and the corresponding fluid openings form a fluidic pathway when mated.

9. A system in accordance with claim 1, the second sliding rail having one or more fluid openings configured to mate with corresponding fluid openings of the heat exchanger, such that the fluid openings of the second sliding rail and the corresponding fluid openings form a fluidic pathway when mated.

10. An information handling system comprising:
an information handling resource;
a first stationary rail to:
   mechanically couple to a chassis; and
   fluidically couple to an external fluidic source, wherein the first stationary rail receives a cooling fluid from the external fluidic source and carries the cooling liquid internally through at least a portion of the first stationary rail;
a first sliding rail to:
   mechanically couple to the first stationary rail, wherein at least a portion of first sliding rail telescopes with at least a portion of the first stationary rail; and
   fluidically couple to the first stationary rail, wherein the first sliding rail receives the cooling fluid from the first stationary rail and carries the cooling liquid internally through at least a portion of the first sliding rail;
a heat exchanger to:
   thermally couple to the information handling resource;
   fluidically couple to the first sliding rail, wherein the heat exchanger receives the cooling fluid from the first sliding rail and carries the cooling liquid internally through at least a portion of the heat exchanger; and
   transfer heat from the information handling resource to the cooling fluid;
a second sliding rail to fluidically couple to the heat exchanger, wherein the second sliding rail receives the cooling fluid from the heat exchanger and carries the cooling liquid internally through at least a portion of the second sliding rail; and
a second stationary rail to:
   mechanically couple to the chassis opposite the first stationary rail;
   mechanically couple to the second sliding rail, wherein at least a portion of second sliding rail telescopes with at least a portion of the second stationary rail;
   fluidically couple to the second sliding rail, wherein the second stationary rail receives the cooling fluid from the second sliding rail and carries the cooling liquid internally through at least a portion of the second stationary rail.

11. An information handling system in accordance with claim 10, wherein at least one of the first stationary rail, the first sliding rail, the second stationary rail, and the second sliding rail comprises one of a circular cylinder, an elliptical cylinder, a rectangular cylinder, and a triangular cylinder.

12. An information handling system in accordance with claim 10, wherein the heat exchanger comprises a cold plate.

13. An information handling system in accordance with claim 10, wherein the heat exchanger comprises a bare-die heat exchanger.

14. An information handling system in accordance with claim 10, wherein the heat exchanger comprises a direct-contact fluid immersion heat exchanger.

15. An information handling system in accordance with claim 10, further comprising at least one seal configured to provide a fluid seal between the first stationary rail and the first sliding rail.

16. An information handling system in accordance with claim 10, further comprising at least one seal configured to provide a fluid seal between the second stationary rail and the second sliding rail.

17. An information handling system in accordance with claim 10, the first sliding rail having one or more fluid openings configured to mate with corresponding fluid openings of the heat exchanger, such that the fluid openings of the first sliding rail and the corresponding fluid openings form a fluidic pathway when mated.

18. An information handling system in accordance with claim 10, the second sliding rail having one or more fluid openings configured to mate with corresponding fluid openings of the heat exchanger, such that the fluid openings of the second sliding rail and the corresponding fluid openings form a fluidic pathway when mated.

* * * * *